United States Patent
Scharner et al.

(10) Patent No.: US 11,056,660 B2
(45) Date of Patent: Jul. 6, 2021

(54) ORGANIC OPTOELECTRONIC COMPONENT AND METHOD FOR PRODUCING THE SAME

(71) Applicant: PICTIVA DISPLAYS INTERNATIONAL LIMITED, Dublin (IE)

(72) Inventors: Silke Scharner, Regensburg (DE); Daniel Riedel, Regensburg (DE); Arne Fleissner, Regensburg (DE); Thomas Wehlus, Lappersdorf (DE); Nina Riegel, Tegernheim (DE); Johannes Rosenberger, Regensburg (DE)

(73) Assignee: PICTIVA DISPLAYS INTERNATIONAL LIMITED, Dublin (IE)

(*) Notice: Subject to any disclaimer, the term of this patent is extended or adjusted under 35 U.S.C. 154(b) by 239 days.

(21) Appl. No.: 15/314,922

(22) PCT Filed: May 20, 2015

(86) PCT No.: PCT/EP2015/061089
§ 371 (c)(1),
(2) Date: Nov. 29, 2016

(87) PCT Pub. No.: WO2015/181016
PCT Pub. Date: Dec. 3, 2015

(65) Prior Publication Data
US 2018/0205028 A1 Jul. 19, 2018

(30) Foreign Application Priority Data

May 30, 2014 (DE) .................... 10 2014 107 658.3

(51) Int. Cl.
*H01L 51/44* (2006.01)
*H01L 51/52* (2006.01)
(Continued)

(52) U.S. Cl.
CPC ........ *H01L 51/441* (2013.01); *H01L 51/0037* (2013.01); *H01L 51/0056* (2013.01);
(Continued)

(58) Field of Classification Search
None
See application file for complete search history.

(56) References Cited

U.S. PATENT DOCUMENTS 9,799,840 B2 * 10/2017 Schmid ................. C07F 1/005
2005/0285515 A1 * 12/2005 Vlaskin et al. ...... H05B 33/145
313/506
(Continued)

FOREIGN PATENT DOCUMENTS

DE 102012204327 A1 * 9/2013
WO 2012078191 A1 6/2012
(Continued)

OTHER PUBLICATIONS

Machine English translation of Diez et al. (DE-102012204327 A1). Aug. 1, 2019.*
(Continued)

*Primary Examiner* — Jay Yang
(74) *Attorney, Agent, or Firm* — Botos Churchill IP Law LLP

(57) ABSTRACT

The invention relates to an organic optoelectronic component (10) comprising a first electrode layer (2), having a doped matrix material and metal nanowires, an organic active layer (3), which is suitable for emitting or detecting electromagnetic radiation, and a second electrode layer (6). The organic active layer (3) is directly adjacent to the first electrode layer (2). The invention further relates to a method for producing the organic optoelectronic component (10).

9 Claims, 1 Drawing Sheet

Figure 1:
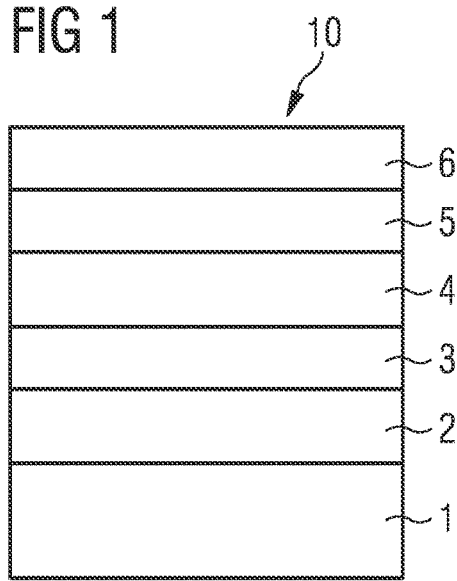

(51) Int. Cl.
    *H01L 51/00* (2006.01)
    *H01L 51/50* (2006.01)
    *H01L 51/56* (2006.01)
(52) U.S. Cl.
    CPC ........ *H01L 51/0091* (2013.01); *H01L 51/506* (2013.01); *H01L 51/5072* (2013.01); *H01L 51/5203* (2013.01); *H01L 51/5206* (2013.01); *H01L 51/56* (2013.01); *H01L 2251/5369* (2013.01)

(56) References Cited

U.S. PATENT DOCUMENTS

2011/0139253 A1   6/2011   Wachi et al.
2012/0104374 A1   5/2012   Allemand
2014/0338735 A1*  11/2014  Allemand et al. ........................... H01L 31/022425
                                                                     136/255

FOREIGN PATENT DOCUMENTS

WO      2013056155 A2      4/2013
WO   WO-2013/057130 A1 *   4/2013
WO      2013080908 A1      6/2013
WO      2014015284 A1      1/2014
WO      2014051900 A1      4/2014

OTHER PUBLICATIONS

Gaynor, W. et al., "Fully Solution-Processed Inverted Polymer Solar Cells with Laminated Nanowire Electrodes", ACS NANO, vol. 4, No. 1; 2010, pp. 30-34.

"Cambrios Partners with Novaled to Produce 100 sqcm OLED Lighting Tile with New Highly Transparent Electrodes", Press Release, Novaled GmbH, 2013, 2 pgs.

* cited by examiner

ORGANIC OPTOELECTRONIC COMPONENT AND METHOD FOR PRODUCING THE SAME

The invention relates to an organic optoelectronic component, in particular an organic light-emitting diode (OLED), and to a method for producing the organic optoelectronic component.

This patent application claims priority of German patent application 10 2014 107 658.3, the disclosure of which is incorporated herein by reference.

In organic light-emitting diodes, indium tin oxide (ITO) is often times used as electrode material since it is transparent and well-conductive. Indium tin oxide layers are usually applied by sputtering.

Furthermore, wet-chemical deposition electrode materials for organic light-emitting diodes are known, in particular conductive polymers such as PEDOT (poly(3,4-ethylen dioxythiophen) or PEDOT:PSS (poly(3,4-ethylendioxythiopen)/poly(styrolsulfonate).

Furthermore, use of silver nanowires as electrode material is known. Wet-chemically processable silver nanowires are suitable for producing electrodes in organic light-emitting diodes due to the transparency and conductivity. Conductivity can be adjusted through the concentration of silver nanowires in a solution, but transparency decreases along with an increasing concentration of silver nanowires.

Usually, further layers are applied to the anode electrode of an organic light-emitting diode, in particular a hole injection layer (HIL) and a hole transport layer (HTL) are deposited in further method steps. In particular in wet-chemical deposition of the further layers, there is a risk of solubilizing the underlying layers, thereby not obtaining defined interfaces. This is very critical particularly in layers with a thickness of only a few nanometers since both uniform charge transfer can be impaired and inhomogenities may be discernable in the luminescence pattern. In particular, effectivity of the charge carrier injection of a layer acting as an electrode with silver nanowires into adjacent layers, in particular hole injection layers or hole transport layers, may be reduced due to inhomogenities.

One object to be achieved is to provide an improved organic optoelectronic component, which is characterized by an improved electrode layer, which can be produced wet-chemically and which is characterized by a particularly effective and uniform charge carrier injection into the active layer. Furthermore, a method for producing the optoelectronic organic component is provided.

These objects are achieved by an organic optoelectronic component and by a method for producing the same according to the independent claims. Advantageous embodiments and developments of the invention are the subject-matter of the dependent claims.

According to at least one embodiment, the organic optoelectronic component comprises a first electrode layer which comprises a doped matrix material and metal nanowires. Furthermore, the organic optoelectronic component comprises an organic active layer that is suitable for emission or detection of electromagnetic radiation. The organic optoelectronic component may particularly be an organic light-emitting component such as an organic light-emitting diode, wherein the organic active layer is the light-emitting layer. As an alternative, it is possible that the organic optoelectronic component is a radiation-detecting organic component such as an organic solar cell, wherein the organic active layer is the light-detecting layer.

According to at least one embodiment, the organic optoelectronic component further comprises a second electrode layer, wherein the organic active layer is arranged between the first electrode layer and the second electrode layer.

According to at least one embodiment, the organic active layer directly adjoins the first electrode layer. In other words, advantageously, intermediate layers are not arranged between the first electrode layer and the organic active layer. In particular, there is no charge carrier injection layer and/or charge carrier transport layer between the first electrode layer and the organic active layer. Rather, the first electrode layer per se acts as a charge carrier injection layer and/or charge carrier transport layer. This is in particular achieved in that the first electrode layer is formed by a doped matrix material, which additionally contains metal nanowires. The metal nanowires act as electrode material. In particular, the metal nanowires form an electrically conductive network in the first electrode layer. Such an electrode is referred to as percolation electrode.

At the same time, the doped matrix material, with the metal nanowires contained therein, acts as a charge carrier transport material and/or a charge carrier injection material.

The first electrode layer may particularly be the anode electrode layer of the organic optoelectronic component. In this case, preferably, neither a hole injection layer nor a hole transport layer is arranged between the first electrode layer and the organic active layer. In particular, the matrix material may comprise a hole injection material and/or a hole transport material. In contrast to organic light-emitting diodes, in which a hole injection material and a hole transport material are arranged as separate layers between the anode electrode layer and the organic active layer, a hole injection material and/or a hole transport material is advantageously used as a matrix material for the metal nanowires in the organic optoelectronic component described herein, said materials acting as electrode material. Thus, advantageously, the first electrode layer is a multifunction layer, which fulfills the functions of an electrode layer as well as of a hole injection layer and/or a hole transport layer at the same time.

In particular, the metal nanowires and the doped matrix material, which may in particular be a hole transport material or a hole injection material, are applied from a solution in the production of the first electrode layer in one single method step. The first electrode layer may particularly be applied from a solution to a carrier material, e.g. a substrate of the organic optoelectronic component. Application is effected, for example, by spin coating, slot coating or coating with a doctor blade.

The matrix material may in particular comprise a hole injection material which comprises or consists of at least one of the following materials: PEDOT (Poly(3,4-Ethylendioxy-thiophen), PAni (Polyanilin), NPB (N,N'-Bis(naphthalene-1-yl)-N,N'-bis(phenyl)-benzidine); beta-NPB N,N'-Bis (naphthalene-2-yl)-N,N'-bis(phenyl)-benzidine); TPD (N,N'-Bis(3-methylphenyl)-N,N'-bis(phenyl)-benzidine); Spiro TPD (N,N'-Bis(3-methylphenyl)-N,N'-bis(phenyl)-benzidine); Spiro-NPB (N,N'-Bis(naphthalene-1-yl)-N,N'-bis(phenyl)-spiro); DMFL-TPD N,N'-Bis(3-methylphenyl)-N,N'-bis(phenyl)-9,9-dimethyl-fluorene); DMFL-NPB (N,N'-Bis(naphthalene-1-yl)-N,N'-bis(phenyl)-9,9-dim-ethyl-fluorene); DPFL-TPD (N,N'-Bis(3-methylphenyl)-N, N'-bis(phenyl)-9,9-diphenyl-fluoren); DPFL-NPB (N,N'-Bis (naphthalene-1-yl)-N,N'-bis(phenyl)-9,9-diphenyl-fluoren); Spiro-TAD (2,2',7,7'-Tetrakis(n,n-diphenylamino)-9,9'-spi-robifluorene); 9,9-Bis[4-(N,N-bis-biphenyl-4-yl-amino) phenyl]-9H-fluorene; 9,9-Bis[4-(N,N-bis-naphthalene-2-ylamino)phenyl]-9H-fluorene; 9,9-Bis[4-(N,N'-bis-naphthalene-2-yl-N,N'-bis-phenyl-amino)-phenyl]-9H-fluorine; N,N' bis(phenanthren-9-yl)-N,N'-bis(phenyl)-benzidine; 2,7Bis[N,N-bis(9,9-spiro-bifluorene-2-yl)-amino]-9,9-spiro-bifluorene; 2,2'-Bis[N,N-bis(biphenyl-4-yl)amino]9,9-spiro-bifluorene; 2,2'-Bis(N,N-di-phenyl-amino)9,9-spiro-bifluorene; Di-[4-(N,N-ditolyl-amino)-phenyl]cyclohexan; 2,2',1,1' tetra(N,N-di-tolyl)amino-spiro-bifluorene; N,N,N',N'-tetra-naphthalene-2-yl-benzidine.

Furthermore, the matrix material may comprise a hole transport material which contains or consists of at least one of the following materials: NPB (N,N'-Bis(naphthalene-1-yl)-N,N'-bis(phenyl)-benzidine); beta-NPB (N,N'-Bis(naphthalene-2-yl)-N,N'-bis(phenyl)-benzidine); TPD (N,N'-Bis(3-methylphenyl)-N,N'-bis(phenyl)-benzidine); Spiro-TPD (N,N'-Bis(3-methylphenyl)-N,N'-bis(phenyl)-benzidine); Spiro-NPB (N,N'-Bis(naphthalene-1-yl)-N,N'-bis(phenyl)-spiro); DMFL-TPD (N,N'-Bis(3-methylphenyl)-N,N'-bis(phenyl)-9,9-dimethyl-fluorene); DMFL-NPB (N,N'-Bis(naphthalene-1-yl)-N,N'-bis(phenyl)-9,9-dimethyl-fluorene); DPFL-TPD (N,N'-Bis(3-methylphenyl)-N,N'-bis(phenyl)-9,9-diphenyl-fluorene); DPFL-NPB (N,N'-Bis(naphthalene-1-yl)-N,N'-bis(phenyl)-9,9-diphenyl-fluorene); Spiro-TAD (2,2',7,7'-Tetrakis(n,n-diphenylamino)-9,9'-spirobifluorene); 9,9-Bis[4-(N,N-bis-biphenyl-4-yl-amino)phenyl]-9H-fluorene; 9,9-Bis[4-(N,N-bis-naphthalene-2-yl-amino)phenyl]-9H-fluorene; 9,9-Bis[4-(N,N'-bis-naphthalene-2-yl-N,N'-bis-phenyl-amino)-phenyl]-9H-fluorine; N,N' bis(phenanthren-9-yl)-N,N'-bis(phenyl)-benzidine; 2,7-Bis[N,N-bis(9,9-spiro-bifluorene-2-yl)-amino]-9,9-spiro-bifluorene; 2,2'-Bis[N,N-bis(biphenyl-4-yl)amino]9,9-spiro-bifluorene; 2,2'-Bis(N,N-di-phenyl-amino)9,9-spiro-bifluorene; Di-[4-(N,N-ditolyl-amino)-phenyl]cyclohexan; 2,2',7,7'-tetra(N,N-di-tolyl)amino-spiro-bifluorene; N,N,N',N' tetra-naphthalene-2-yl-benzidine.

According to at least one embodiment, the matrix material is doped with a copper or bismuth compound. In particular, Cu(I)pFBz, Bi(III)pFBz or F16CuPc are suitable dopants.

Further suitable dopants are PSS (polystyrene sulfonate), HAT-CN, MoOx, WOx, VOx, ReOx, F4-TCNQ, NDP-2, NDP-9.

The first electrode layer may in particular be the anode electrode layer of the optoelectronic component. In an alternative configuration, the first electrode layer is a cathode electrode layer. In this case, the matrix material advantageously comprises an electron injection material and/or an electron transport material. In a such configuration, the metal nanowires are advantageously embedded in an electron injection material and/or electron transport material as a matrix material, so that advantageously, in the organic optoelectronic component, a separate electron transport layer and/or electron injection layer may be omitted.

The matrix material may particularly comprise an electron injection material, which comprises or consists of at least one of the following materials: NDN-26, MgAg, Cs2C03, Cs3P04, Na, Ca, K, Mg, Cs, Li, LiF; 2,2',2"-(1,3,5-Benzinetriyl)-tris(1-phenyl-1-H-benzimidazole); 2-(4-Biphenylyl)-5-(4-tert-butylphenyl)-1,3,4-oxadiazo1,2,9-Dimethyl-4,7-diphenyl-1,10-phenanthroline (BCP); 8-Hydroxyquinolinolato-lithium, 4-(Naphthalene-1-yl)-3,5-diphenyl-4H-1,2,4-triazole; 1,3-Bis[2-(2,2'-bipyridin-6-yl)-1,3,4-oxadiazo-5-yl]benzene; 4,7-Diphenyl-1,10-phenanthroline (BPhen); 3-(4-Biphenylyl)-4-phenyl-5-tert-butylphenyl-1,2,4-triazole; Bis(2-methyl-8-quinolinolat)-4-(phenylphenolato)aluminum; 6,6'-Bis[5-(biphenyl-4-yl)-1,3,4-oxadiazo-2-yl]-2,2'-bipyridyl; 2-phenyl-9,10-di (naphthalene-2-yl)-anthracene; 2,7-Bis[2-(2,2'-bipyridine-6-yl)-1,3,4-oxadiazo-5-yl]-9,9-dimethylfluoren; 1,3-Bis[2-(4-tert-butylphenyl)-1,3,4-oxadiazo-5-yl]benzen; 2-(naphthalene-2-yl)-4.7-diphenyl-1,10-phenanthroline; 2,9-Bis(naphthalene-2-yl)-4.7-diphenyl-1,10-phenanthroline; Tris(2,4,6-trimethyl-3-(pyridin-3-yl)phenyl)boran; 1-methyl-2-(4-(naphthalene-2-yl)phenyl)-1H-imidazo[4,5-f][1,10]phenanthroline; Phenyl-dipyrenylphosphinoxide; Naphtahlene-tetra-carbon acid di-anhydride and the imides thereof, respectively; Perylene-tetra carbon acid di-anhydride and the imides thereof; substances based upon silolene with a silacyclopentadien unit.

Furthermore, the matrix material may comprise an electron transport material, which comprises or consists of at least one of the following materials: NET-18; 2,2',2"-(1,3,5-Benzinetriyl)-tri s(1-phenyl-1-H-benzimidazole); 2-(4-Biphenylyl)-5-(4-tert-butylphenyl)-1,3,4-oxadiazo1,2,9-Dimethyl-4,7-diphenyl-1,10-phenanthroline (BCP); 8-Hydroxyquinolinolato-lithium, 4-(Naphthalene-1-yl)-3,5-diphenyl-4H-1,2,4-triazole; 1,3-Bis[2-(2,2'-bipyridine-6-yl)-1,3,4-oxadiazo-5-yl]benzen; 4,7-Diphenyl-1,10-phenanthroline (BPhen); 3-(4-Biphenylyl)-4-phenyl-5-tert-butylphenyl-1,2,4-triazole; Bis(2-methyl-8-quinolinolat)-4-(phenylphenolato)aluminium; 6,6'-Bis[5-(biphenyl-4-yl)-1, 3,4-oxadiazo-2-yl]-2,2'-bipyridyl; 2-phenyl-9,10-di (naphthalene-2-yl)-anthracene; 2,7-Bis[2-(2,2'-bipyridine-6-yl)-1,3,4-oxadiazo-5-yl]-9,9-dimethylfluoren; 1,3-Bis[2-(4-tert-butylphenyl)-1,3,4-oxadiazo-5-yl]benzen; 2-(naphthalene-2-yl)-4,7-diphenyl-1,10-phenanthroline; 2,9-Bis(naphthalene-2-yl)-4,7-diphenyl-1,10-phenanthroline; Tris(2,4,6-trimethyl-3-(pyridin-3-yl)phenyl)boran; 1-methyl-2-(4-(naphthalene-2-yl)phenyl)-1H-imidazo[4,5-f][1,10]phenanthroline; Phenyl-dipyrenylphosphinoxide; Naphtahlene-tetra carbon acid di-anhydride or the imides thereof; Perylene-tetra carbon acid di-anhydride or the imides thereof; substances based upon silolene having a Silacyclopentadien-unit.

The proposed principle of embedding metal nanowires in a charge carrier injection material and/or a charge carrier transport material can, in other words, be applied to the anode electrode layer and/or the cathode electrode layer of the organic optoelectronic component.

In particular, it is also possible that both the first electrode layer and the second electrode layer each comprise a doped matrix material, with metal nanowires embedded therein. In said configuration, e.g. the first electrode layer is the anode electrode layer and comprises a hole injection material and/or a hole transport material with metal nanowires. The second electrode layer is the cathode electrode layer in this configuration and, advantageously, may comprise an electron injection material and/or an electron transport material with metal nanowires embedded therein.

In the organic optoelectronic component, the metal nanowires preferably are silver nanowires that are characterized by high electric conductivity.

As an alternative, the metal nanowires may be aluminum nanowires or copper nanowires.

In the method for producing an organic optoelectronic component, a first electrode layer that comprises a doped matrix material and metal nanowires, is applied in a wet-chemical manner. The first electrode layer may particularly be applied to a substrate of the organic optoelectronic component. Wet-chemical application is effected from a solution such as spin-coating, slot-coating or coating by means of a doctor blade. For wet-chemical application of the first electrode layer, preferably a solvent is used, said solvent preferably being a polar solvent. Suitable solvents particularly are aryl-alkyl-ether such as phenetole or anisole, a di-ether such as dioxin or an alkylbenzene such as tuluol or xylol.

As a result of the fact that the doped matrix material, which may particularly act as a hole injection material and/or hole transport material, and the metal nanowires are applied in a single method step in the method, the otherwise required three method steps of applying an anode electrode layer, a hole injection layer and a hole transport layer are combined in a single method step, thereby significantly simplifying the production method. In particular, three separate coating and drying steps can be replaced by one single coating and drying step. After that, the processing time can be reduced to one third, thereby also reducing the material cost, in particular for solvents.

Application of the electrode material and of the doped matrix material in one single method step provides the advantage that the risk of solubilizing an underlying layer, which would be present in separate application of a hole injection layer and/or a hole transport layer, does not occur.

Further advantageous embodiments of the method result from the description of the organic optoelectronic component and vice versa.

In the following, the invention is explained in greater detail in conjunction with FIGS. 1 to 3.

Figure 2:
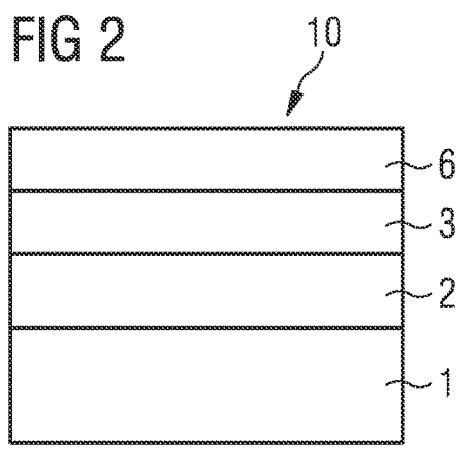
Figure 3:
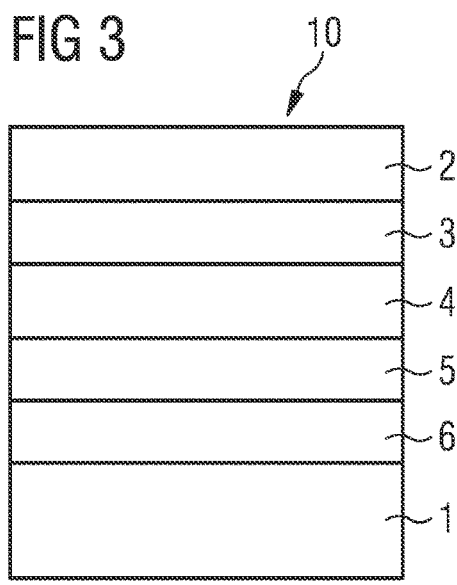

The figures show in:

FIG. 1 a schematic illustration of a cross-section through an organic optoelectronic component according to a first exemplary embodiment, FIG. 2 a schematic illustration of a cross-section through an organic optoelectronic component according to a second exemplary embodiment, and FIG. 3 a schematic illustration of a cross-section through an organic optoelectronic component according to a third exemplary embodiment.

Throughout the drawings, equal or equivalent components are indicated with like reference numerals, respectively. The illustrated components as well as size ratios are not made to scale.

FIG. 1 schematically illustrates the layer sequence of an optoelectronic component 10 according to a first exemplary embodiment, which is an organic light-emitting diode (OLED). The organic light-emitting diode 10 comprises a functional layer stack, with a substrate 1 being arranged thereon. In particular, substrate 1 may be a flexible substrate such as a foil.

Preferably, substrate 1 is a transparent substrate, in particular a transparent glass layer or polymer layer. In this configuration, the organic light-emitting diode 10 is capable of emitting light through the transparent substrate (bottom emitter) or be designed as a light-emitting diode emitting on both sides.

As an alternative, it is also possible that substrate 1 is a non-transparent, preferably reflecting substrate 1. In this configuration, the organic light-emitting diode 10 emits in a direction facing away from substrate 1 upwards (top emitter). In this case, substrate 1 may particularly be a reflective metal foil.

The organic light-emitting diode 10 comprises a first electrode layer 2 and second electrode layer 6, wherein an organic active layer 3 is arranged between the electrode layers 2, 6, which is a light-emitting layer. In the exemplary embodiment, the first electrode layer 2 forms the anode and the second electrode layer 6 forms the cathode of the organic light-emitting diode 10.

The first electrode layer 2 advantageously comprises an organic matrix material which comprises at least one dopant and metal nanowires. The metal nanowires, which are embedded in the matrix material of the first electrode layer 2, are preferably silver nanowires. As an alternative, other metals such as aluminum or copper are also suitable.

The doped matrix material of electrode layer 2 is advantageously a hole injection material and/or a hole transport material. The dopant of the matrix material may preferably be a copper or bismuth complex.

The light-emitting organic active layer 3 of the organic light-emitting diode 10 advantageously is directly adjacent to the first electrode layer 2. In particular, compared to the conventional structure of organic light-emitting diodes, neither a hole injection layer nor a hole transport layer is arranged between the first electrode layer 2 and the organic active layer 3. Such separate hole injection layers or hole transport layers are advantageously not required in the organic light-emitting diode 10, since a hole injection material and/or a hole transport material is used as a matrix material for the first electrode layer 2. The first electrode layer 2 thus advantageously functions both as an anode electrode and as a hole injection layer and/or a hole transport layer.

In the production of the organic light-emitting diode 10, the first electrode layer 2, which advantageously has the functions of up to three individual layers, can be applied in a single method step from a solution to the substrate 1. The organic light-emitting diode 10 is thus characterized by a particularly low production effort.

In the production of the organic light-emitting diode 10, the metal nanowires as well as the doped matrix material, which particularly comprises the hole injection material and/or the hole transport material, is dissolved in a solvent, the solvent preferably a polar solvent. Suitable solvents particularly are an aryl-alkyl-ether such as phenetole or anisole, a diether such as dioxane or an alkylbenzene such as toluene or xylol.

Application of the first electrode layer 2 from the solution can particularly be effected by means of spin-coating, slot-coating or coating by means of a doctor blade. Subsequently, the first electrode layer 2 is preferably dried by means of a heating process.

Since application of a separate hole injection layer and hole transport layer is omitted when compared to conventional organic light-emitting diodes, the risk of damage to the first electrode layer caused by solubilizing while applying the subsequent layer is reduced. Since only one single layer is applied instead of two or even three layers, at least an interface in the organic layer stack is omitted, thereby reducing potential inhomogenities at the interface and efficiency losses caused thereby.

After application of the first electrode layer 2 and a possibly conducted drying process, the light-emitting organic active layer 3 is advantageously directly applied on the first electrode layer 2. Application of the light-emitting organic layer 3 and the further subsequent layers can be effected by vapor deposition or a further wet-chemical process. Due to the fact that the light-emitting organic active layer 3 is directly adjacent to the first electrode layer 2, hole injection of the first electrode layer 2 acting as an anode into the active layer 3 is particularly efficient.

In the exemplary embodiment of FIG. 1, the light-emitting organic active layer 3 is followed by an electron transport layer 4, an electron injection layer 5 and the second electrode layer 6, which is the cathode of the organic light-emitting diode 10. The second electrode layer 6 may particularly be a thin metal layer, for example of aluminum. The organic layer stack and the second electrode layer may be provided with an encapsulation layer for protection, in particular with a so-called thin film encapsulation. Furthermore, a cover plate or cover layer such as a glass plate may be applied on a side of the organic light-emitting diode 10 opposite the substrate. Suitable encapsulations and/or cover layers for organic light-emitting diodes are known per se and thus not illustrated in FIG. 1 for simplicity.

In the exemplary embodiment illustrated in FIG. 1, it is alternatively possible that the first electrode layer 2 forms the cathode of the organic light-emitting diode 10. In this configuration, the first electrode layer 2 comprises a doped matrix material, which is an electron injection material and/or an electron transport material. In this configuration, the second electrode layer 6 is the anode electrode of the organic light-emitting diode 10. Corresponding to the inverted polarity compared to the preceding configuration described above, a hole transport layer 4 and a hole injection layer 5 are arranged between the light-emitting organic layer 3 and the second electrode layer 6 in this case, for example.

FIG. 2 shows another advantageous embodiment of an organic optoelectronic component 10, which is an organic light-emitting diode as in the first exemplary embodiment.

The substrate 1, the first electrode layer 2 and the light-emitting organic active layer 3 of the second exemplary embodiment correspond to the first exemplary embodiment with respect to their advantageous designs and advantages. In particular, the first electrode layer 2 comprises a doped matrix material, which comprises a hole injection material and/or a hole transport material as well as metal nanowires embedded therein, in particular silver nanowires. The light-emitting organic active layer 3 advantageously is directly adjacent to the first electrode layer 2.

In the second exemplary embodiment, the second electrode layer 6 is directly adjacent to the organic active layer 3 as well. Particularly in this exemplary embodiment, neither an electron transport layer nor an electron injection layer is arranged between the light-emitting organic active layer 3 and the second electrode layer 6, in contrast to the first exemplary embodiment. The second electrode injection layer 6 rather comprises a doped matrix material which comprises an electron injection material and/or an electron transport material, wherein metal nanowires such as silver nanowires are embedded in the doped matrix material. In this case, the second electrode layer 6 is the cathode of the organic light-emitting diode 10.

In the second exemplary embodiment, not only the first electrode layer 2 but also the second electrode layer 6 is designed as a multifunctional layer, with the second electrode layer 6 combining the functions of the cathode electrode, an electron injection layer and/or an electron transport layer. In this case, advantageously, the second electrode layer may also be applied from a solution with the additional functions of an electron injection layer and/or an electron transport layer in one single method step. The organic light-emitting diode 10 produced this way is thus characterized by a particularly low manufacturing effort.

In the second exemplary embodiment, it is possible that the layers are arranged on the substrate 1 in a reversed order so that the second electrode layer 6 is arranged on the substrate and the first electrode layer 2 is arranged in a side of the organic light-emitting diode 10 facing away from the substrate.

FIG. 3 illustrates another advantageous embodiment of an organic optoelectronic component 10, which is an organic light-emitting diode.

In this exemplary embodiment, the layers are applied to the substrate 1 in reversed order compared to the first exemplary embodiment. As a first layer, the second electrode layer 6 is applied to the substrate 1, which forms the cathode of the organic light-emitting diode 10. The second electrode layer 6 is followed by an electron injection layer 5, an electron transport layer 4 and the light-emitting organic active layer 3. The first electrode layer 2, which comprises a doped matrix material and metal nanowires, is directly adjacent to the light-emitting organic layer 3.

The first electrode layer 2 corresponds to the first exemplary embodiment with respect to its properties and advantages. The first electrode layer 2 may particularly be transparent. In the third exemplary embodiment, the organic light-emitting diode 10 may be designed as a top-emitter, which emits upwards viewed from the substrate 1. In this case, for example, the second electrode layer 5 is a reflecting metal layer. Alternatively or additionally, the substrate 1 may have a reflecting design, for example the substrate 1 may be a reflecting metal foil.

The organic light-emitting diode 10 may alternatively be designed as a light-emitting diode emitting on both sides. In this case, the first electrode layer 2, the second electrode layer 6 and the substrate 1 are each advantageously transparent.

The invention is not limited by the description in conjunction with the exemplary embodiments. The invention rather comprises any new feature as well as any combination of features, particularly including any combination of features in the claims, even if said feature or said combination of features per se is not explicitly indicated in the claims or in the exemplary embodiments.

The invention claimed is:

1. Organic optoelectronic component, comprising:
   a homogenous, single layer first electrode, which comprises a doped matrix material and metal nanowires wherein the matrix material is doped with a copper or bismuth compound,
   an organic active layer, which is suitable for emission or detection of electromagnetic radiation, wherein the organic active layer is directly adjacent to the single layer first electrode, and
   a second electrode layer.

2. Organic optoelectronic component according to claim 1, wherein the matrix material comprises a hole injection material and/or a hole transport material.

3. Organic optoelectronic component according to claim 2, wherein the matrix material is a hole transport material.

4. Organic optoelectronic component according to claim 2, wherein the hole transport material contains or consists of at least one of the following materials: NPB (N,N'-Bis (naphthalene-1-yl)-N,N'-bis(phenyl)-benzidine); beta-NPB (N,N'-Bis(naphthalene-2-yl)-N,N'-bis(phenyl)-benzidine); TPD (N,N-Bis(3-methylphenyl)-N,N'-bis(phenyl)-benzidine); Spiro-TPD (N,N'-Bis(3-methylphenyl)-N,N'-bis(phenyl)-benzidine); Spiro-NPB (N,N'-Bis(naphthalene-1-yl)-N,N'-bis(phenyl)-spiro); DMFL-TPD (N,N'-Bis(3-methylphenyl)-N,N'-bis(phenyl)-9,9-dimethyl-fluorene); DMFL-NPB (N,N'-Bis(naphthalene-1-yl)-N,N'-bis(phenyl)-9,9-dimethyl-fluorene); DPFL-TPD (N,N'-Bis(3-methylphenyl)-N,N'-bis(phenyl)-9,9-diphenyl-fluorene); DPFL-NPB (N,N'-Bis(naphthalene-1-yl)-N,N'-bis(phenyl)-9,9-diphenyl-fluorene); Spiro-TAD (2,2',7,7'-Tetrakis(n,n-diphenylamino)-9,9'-spirobifluorene); 9,9-Bis[4-(N,N-bis-biphenyl-4-yl-amino)phenyl]-9H-fluorene; 9,9-Bis[4-(N,N-bis-naphthalene-2-yl-amino)phenyl]-9H-fluorene; 9,9-Bis[4-(N,N'-bis-naphthalene-2-yl-N,N'-bis-phenyl-amino)-phenyl]-9H-fluorine; N,N' bis (phenanthren-9-yl)-N,N'-bis(phenyl)-benzidine; 2,7-

Bis[N,N-bis(9,9-spiro-bifluorene-2-yl)-amino]-9,9-spiro-bifluorene; 2,2'-Bis[N,N-bis(biphenyl-4-yl)amino]9,9-spiro-bifluorene;

2,2'-Bis(N,N-di-phenyl-amino)9,9-spiro-bifluorene; Di-[4-(N,N-ditolyl-amino)-phenyl]cyclohexan; 2,2',7,7'-tetra(N, N-di-tolyl)amino-spiro-bifluorene; N,N,N',N' tetra-naphthalene-2-yl-benzidine.

5. Organic optoelectronic component according to claim 1, wherein the copper or bismuth compound is Cu(I)pFBz (copper (I) pentafluorobenzene), Bi(III)pFBz (bismuth (III) pentafluorobenzene) or F16CuPc (hexadecafluorophtalocyanine).

6. Organic optoelectronic component according to claim 1, wherein the organic optoelectronic component is an organic light-emitting diode.

7. Organic optoelectronic component according to claim 1, wherein the metal nanowires are silver nanowires, aluminum nanowires or copper nanowires.

8. Organic optoelectronic component, comprising:
a homogenous, single layer first electrode, which comprises a doped matrix material and metal nanowires,
an organic active layer, which is suitable for emission or detection of electromagnetic radiation, wherein the organic active layer is directly adjacent to the single layer first electrode, and
a second electrode layer,
wherein the matrix material is a hole transport material, and the hole transport material contains or consists of at least one of the following materials:
N'PB (N,N'-Bis(naphthalene-1-yl)-N,N'-bis(phenyl)-benzidine); beta-NPB (N,N'-Bis(naphthalene-2-yl)-N,N'-bis(phenyl)-benzidine); TPD (N,N'-Bis(3-methylphenyl)-N,N'-bis(phenyl)-benzidine); Spiro-TPD (N,N'-Bis(3-methylphenyl)-N,N'-bis(phenyl)-benzidine); Spiro-NPB (N,N'-Bis(naphthalene-1-yl)-N,N'-bis(phenyl)-spiro); DMFL-TPD (N,N'-Bis(3-methylphenyl)-N,N'-bis(phenyl)-9,9-dimethyl-fluorene); DMFL-NPB (N,N'-Bis(naphthalene-1-yl)-N,N'-bis(phenyl)-9,9-dimethyl-fluorene); DPFL-TPD (N,N'-Bis(3-methylphenyl)-N,N'-bis(phenyl)-9,9-diphenyl-fluorene); DPFL-NPB (N,N'-Bis(naphthalene-1-yl)-N,N'-bis(phenyl)-9,9-diphenyl-fluorene); Spiro-TAD (2,2',7,7'-Tetrakis(n,n-diphenylamino)-9,9'-spirobifluorene); 9,9-Bis[4-(N,N-bis-biphenyl-4-yl-amino)phenyl]-9H-fluorene; 9,9-Bis[4-(N,N-bis-naphthalene-2-yl-amino)phenyl]-9H-fluorene; 9,9-Bis[4-(N,N'-bis-naphthalene-2-yl-N,N'-bis-phenyl-amino)-phenyl]-9H-fluorine; N,N'bis(phenanthren-9-yl)-N,N'-bis(phenyl)-benzidine; 2,7-Bis[N,N-bis(9,9-spiro-bifluorene-2-yl)-amino]-9,9-spiro-bifluorene; 2,2'-Bis[N,N-bis(biphenyl-4-yl)amino]9,9-spiro-bifluorene;

2,2'-Bis(N,N-di-phenyl-amino)9,9-spiro-bifluorene; Di-[4-(N,N-ditolyl-amino)-phenyl]cycl ohexan; 2,2',7,7'-tetra(N,N-di-tolyl)amino-spiro-bifluorene; N,N,N',N' tetra-naphthalene-2-yl-benzidine, or wherein the matrix material is an electron transport material, and the electron transport material comprises or consists of at least one of the following materials:
NET-18; 2,2',2"-(1,3,5-Benzinetriyl)-tris(1-phenyl-1-H-benzimidazole); 2-(4-Biphenylyl)-5-(4-tert-butylphenyl)-1,3,4-oxadiazole, 2,9-Dimethyl-4,7-diphenyl-1,10-phenanthrolin (BCP); 8-Hydroxyquinolinolato-lithium, 4-(Naphthalene-1-yl)-3,5-diphenyl-4H-1,2,4-triazole; 1,3-Bis[2-(2,2'-bipyridine-6-yl)-1,3,4-oxadiazo-5-yl]benzene; 4,7-Diphenyl-1,10-phenanthrolin (BPhen);
3-(4-Biphenyiyl)-4-phenyl-1-5-tert-butylphenyl-1,2,4-triazole; Bis(2-methyl-8-quinolinolat)-4-(phenylphenolato)aluminum; 6,6'-Bis[5-(biphenyl-4-yl)-1,3,4-oxadiazo-2-yl]-2,2'-bipyridyl; 2-phenyl-9,10-di(naphthalene-2-yl)-anthracene; 2,7-Bis[2-(2,2'-bipyridin-6-yl)-1,3,4-oxadiazo-5-yl]-9,9-dimethylfluorene; 1,3-Bis[2-(4-tert-butylphenyl)-1,3,4-oxadiazo-5-yl]benzene; 2-(naphthalene-2-yl)-4,7-diphenyl-1,10-phenanthrolin; 2,9-Bis(naphthalene-2-yl)-4,7-diphenyl-1,10-phenanthrolin; Tris(2,4,6-trimethyl-3-(pyridin-3-yl)phenyl)borane; 1-methyl-2-(4-(naphthalene-2-yl)phenyl)-1H-imidazole[4,5-f][1,10]phenanthroline;
Phenyl-dipyrenylphosphinoxide; naphthalene-tetra carbon acid hydride or imides thereof;
perylene-tetra carbon acid di-anhydride or imides thereof; substances based upon siloles with a silacydopentadiene unit.

9. Organic optoelectronic component, comprising:
a homogenous, single layer first electrode, which comprises a doped matrix material and metal nanowires wherein the matrix material is doped with a copper or bismuth compound,
an organic active layer, which is suitable for emission or detection of electromagnetic radiation, wherein the organic active layer is directly adjacent to the single layer first electrode, wherein no charge carrier injection layer and/or charge carrier transport layer is arranged between the single layer first electrode and the organic active layer, and
a second electrode layer.

\* \* \* \* \*

UNITED STATES PATENT AND TRADEMARK OFFICE
CERTIFICATE OF CORRECTION

Page 1 of 1

PATENT NO. : 11,056,660 B2
APPLICATION NO. : 15/314922
DATED : July 6, 2021
INVENTOR(S) : Silke Scharner et al.

It is certified that error appears in the above-identified patent and that said Letters Patent is hereby corrected as shown below:

In the Claims

Claim 4, Column 8, Line 52, "TPD (N,N-Bis(3-methylphenyl)-N,N'-bis(phenyl)-benzidine)" should read --TPD (N,N'-Bis(3-methylphenyl)-N,N'-bis(phenyl)-benzidine)--;

Claim 8, Column 9, Line 30, "N'PB" should read --NPB--;

Claim 8, Column 10, Line 4, "cycl ohexan" should read --cyclohexan--;

Claim 8, Column 10, Line 18, "3-(4-Biphenyiyl)-4" should read --3-(4-Biphenylyl)-4--;

Claim 8, Column 10, Line 18, "4-phenyl-1-5-tert-butylphenyl-1,2,4-triazole" should read --4-phenyl-5-tert-butylphenyl-1,2,4-triazole--;

Claim 8, Column 10, Line 24, "dimethylfiuorene" should read --dimethylfluorene--; and Claim 8, Column 10, Line 34, "silacydopentadiene" should read --silacyclopentadiene--.

Signed and Sealed this
Fifth Day of October, 2021

Drew Hirshfeld
*Performing the Functions and Duties of the
Under Secretary of Commerce for Intellectual Property and
Director of the United States Patent and Trademark Office*